United States Patent
Goto et al.

(10) Patent No.: US 6,501,082 B1
(45) Date of Patent: Dec. 31, 2002

(54) PLASMA DEPOSITION APPARATUS AND METHOD WITH CONTROLLER

(75) Inventors: Toshio Goto, Nisshin (JP); Masaru Hori, Nisshin (JP); Masafumi Ito, Osaka-fu (JP); Nobuo Ishii, Osaka-fu (JP); Satoru Kawakami, Sagamihara (JP)

(73) Assignees: Tokyo Electron Limited, Tokyo (JP); Nagoya University, Aichi-ken (JP)

( * ) Notice: Subject to any disclaimer, the term of this patent is extended or adjusted under 35 U.S.C. 154(b) by 0 days.

(21) Appl. No.: 09/527,562

(22) Filed: Mar. 16, 2000

(30) Foreign Application Priority Data

Mar. 17, 1999 (JP) .............................................. 11-071928

(51) Int. Cl.[7] .......................... G21K 5/10; H05H 1/30; A61N 5/00; H01J 37/08
(52) U.S. Cl. .............................. 250/492.21; 250/492.3; 250/423 R; 333/99 PL
(58) Field of Search ............................ 250/281, 423 R, 250/427, 492.21, 492.3; 315/111.21, 39, 111.41; 333/99 PL; 313/231.31

(56) References Cited

U.S. PATENT DOCUMENTS 3,974,380 A * 8/1976 Rettinghaus et al. ....... 250/288
4,933,650 A * 6/1990 Okamoto ..................... 333/99

* cited by examiner

Primary Examiner—John R. Lee
Assistant Examiner—David A. Vanore
(74) Attorney, Agent, or Firm—Finnegan, Henderson, Farabow, Garrett, & Dunner LLP

(57) ABSTRACT

A controlled plasma deposition system and method are provided including a vacuum vessel. An electron adding mass spectrometer is connected to a vacuum vessel for carrying out a gas treatment for a semi-conductor wafer. In the mass spectrometer, a gas in the vacuum vessel is incorporated, and electrons are added to the particles in the gas. Then the value of negative ions obtained by ionizing the particles, for example specific radicals, is measured. Once measured, the information is forwarded to a controller that may optimize the plasma deposition method.

16 Claims, 7 Drawing Sheets

PLASMA DEPOSITION APPARATUS AND METHOD WITH CONTROLLER

BACKGROUND OF THE INVENTION

1. Field of the Invention

The present invention relates generally to a gas treatment system and method for carrying out a plasma treatment with respect to, e.g., a semiconductor waver.

2. Description of the Prior Art

In a process for producing a semiconductor device, there is a process for treating a semiconductor waver (which will be hereinafter referred to as a "wafer") serving as a substrate to be treated, using plasma. This is carried out by introducing a treatment gas into a vacuum vessel having a wafer mounting table and supplying electromagnetic energy to the treatment gas to produce plasma. For example, as such a process, there are deposition and etching. As a technique for producing plasma, there are the ECR system for utilizing the electromagnetic cyclotron resonance which is the interaction between microwaves and a magnetic field, the ICP system for supplying electric and magnetic fields to a treatment gas from a coil wound onto a dome-shaped vessel, and the parallel plate system for applying a high-frequency power between a pair of plates facing each other.

In such a plasma treatment, particles produced in plasma, e.g., radicals, have different functions, such as deposition and etching, in accordance with the kind of the particles, so that it is considered that radicals play an important role in the treatment on a wafer. Therefore, there are disclosed a method for estimating the density of radicals during the production of plasma, and a method for controlling the microwave output by the value thus obtained. As a method for estimating the density of radicals, there are a laser induced fluorescence method (LIF method) for irradiating plasma with laser light to allow molecules to absorb the light to emit fluorescence to estimate the density of radicals on the basis of the measured value of the fluorescence, and a method for detecting the variation in spectrum of an infrared semiconductor laser beam to measure the density of radicals in a vacuum vessel.

However, since the above described LIF method is a method for measuring fluorescent molecules, it is not possible to estimate the density of a non-fluorescent kind of radicals, and it is impossible to measure high-order radicals having a great molecular number, so that there is a problem in that it is not possible to precisely carry out a process control.

Also in the method for measuring the radical density on the basis of the variation in spectrum of the infrared semiconductor laser beam, although it is possible to measure low-order radicals since the spectrum caused by radicals is known, it is impossible to measure high-order radicals having a great molecular number.

SUMMARY OF THE INVENTION

It is therefore an object of the present invention to eliminate the aforementioned problems and to provide a system and method capable of estimating the kind and density of, e.g., radicals, to carry out a good treatment, e.g., a treatment having a small dispersion between substrates to be treated.

In order to accomplish the aforementioned and other objects, according to one aspect of the present invention, there is provided a gas treatment system for supplying a treatment gas into a vacuum vessel to carry out a predetermined treatment for a substrate to be treated, the system comprising: electron adding means for emitting electrons to the treatment gas extracted from the vacuum vessel and for causing electrons to adhere to particles in the treatment gas; mass spectrometry means for determining the kind of negative ions of the particles, to which electrons adhere, by the electron adding means; density estimating means for estimating the density of the particles in the treatment gas corresponding to the determined negative ions, on the basis of the measured value of the number of the negative ions determined by the mass spectrometry means; and a control part for controlling a process condition, which influences the state of the treatment gas in the vacuum vessel, on the basis of the estimated result of the density of the particles estimated by the density estimating means.

The density estimating means may vary the magnitude of electron energy emitted from the electron adding means, to derive the variation in measured value of the negative ions of the particles, to use data corresponding to the peak value of the measured value as the estimated result of the density of the particles. The mass spectrometry means preferably has a gas extracting port which is movable in the vacuum vessel. The electron adding means may be connected to the vacuum vessel via a bellows which is retractable with respect to the vacuum vessel. The process condition may be at least one of the magnitude of energy applied to the treatment gas, the pressure in the vacuum vessel, and the flow rate of the treatment gas. The control part may carry out a feedback in real time on the basis of the estimated result of the density of the particles estimated by the density estimating means, to control the process condition. The control part may set and control the process condition with respect to a subsequent product substrate to be treated, on the basis of the estimated result of the density of the particles estimated by the density estimating means with respect to a test substrate to be treated.

In addition, according to the present invention, the particles in the treatment gas, to which electrons adhere, may be radicals, molecules or atoms. The magnitude of electron energy emitted from the electron adding means is changed to derive the relationship between the magnitude of electron energy and the measured value of the particles, so that the density of the particles can be estimated on the basis of the derived result.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, as an example of a preferred embodiment of a gas treatment system according to the present invention, a plasma deposition system for depositing a thin film on a substrate to be treated by utilizing the electron cyclotron resonance (ECR) will be described below. In this preferred embodiment, a gas in a vacuum vessel is extracted, and electrons are added to the gas to change particles, e.g., radicals, in the gas to negative ions. Then, the quantity of negative ions corresponding to specific radicals is analyzed by a mass spectrometer. On the basis of the results thereof, the density of radicals is estimated. In accordance with the estimated value, various process conditions for influencing radicals in plasma are controlled.

Figure 1:
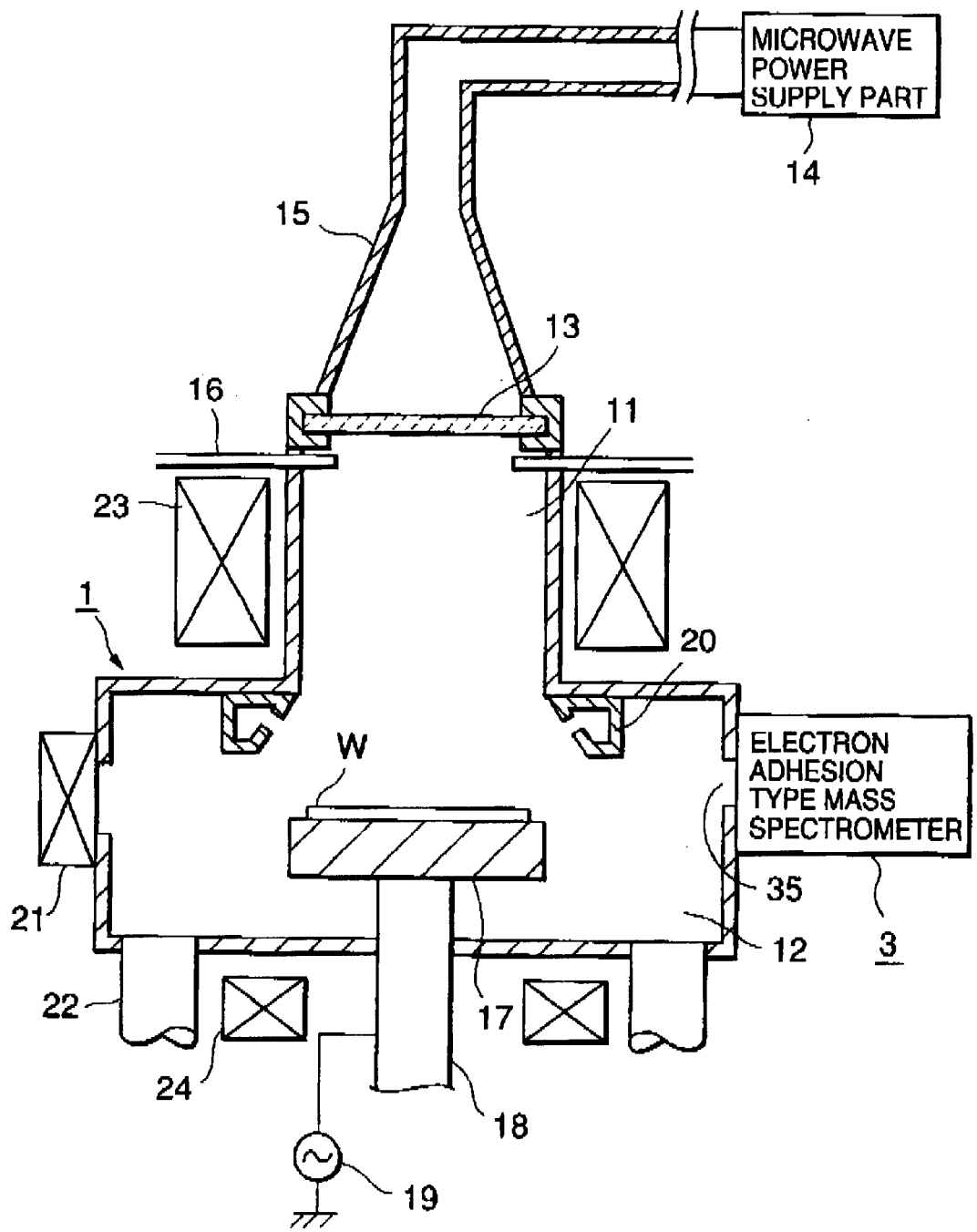
FIG. 1 is a longitudinal section of a preferred embodiment of a treatment system according to the present invention.
Figure 2:
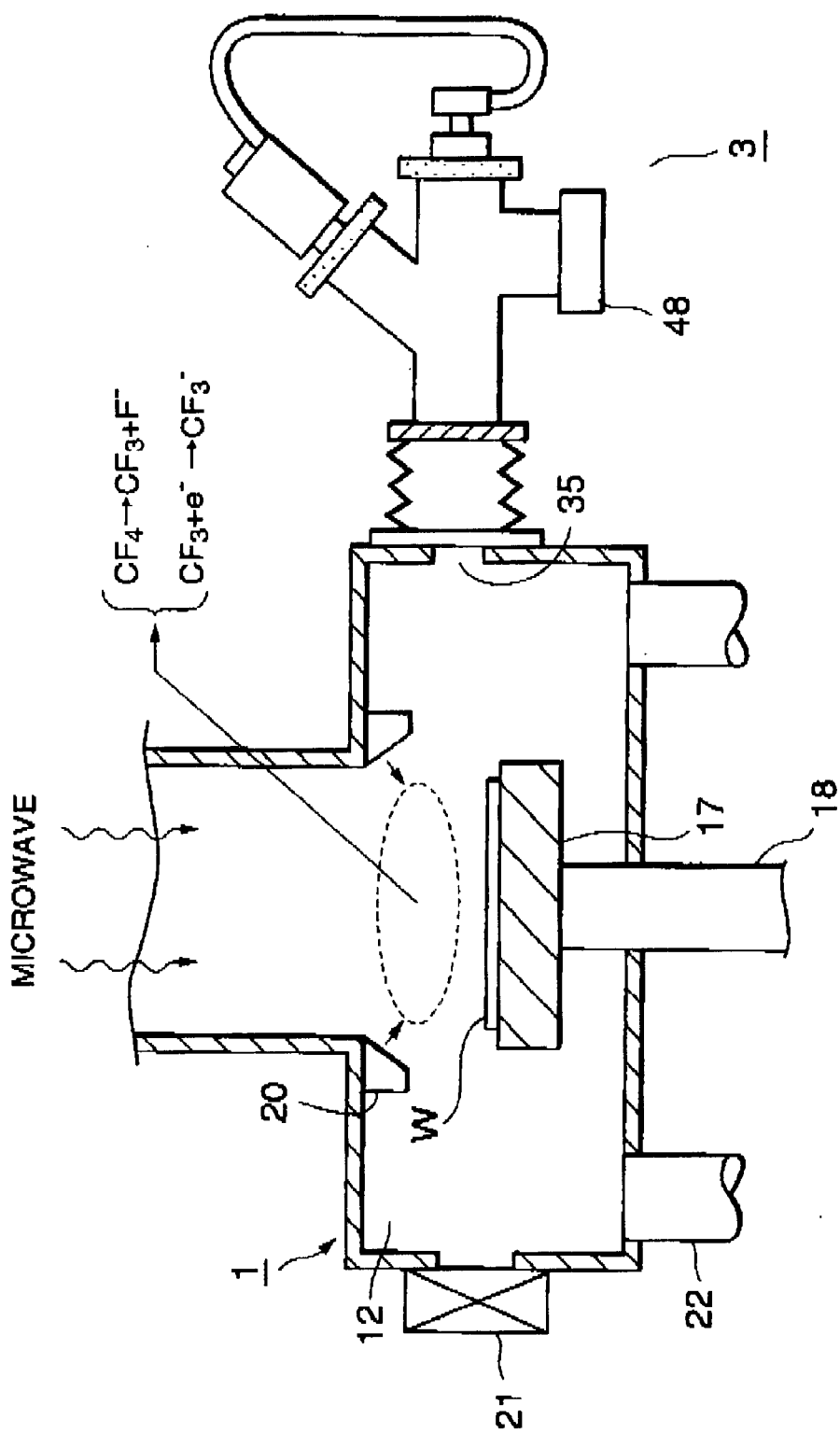
FIG. 2 is a longitudinal section showing a peripheral portion of an electron adhesion type mass spectrometer for use in a treatment system according to the present invention.

FIG. 1 is a sectional view showing the whole construction of the preferred embodiment of a gas treatment system according to the present invention, and FIG. 2 is a side view schematically showing an electron adhesion type mass spectrometer for use in this gas treatment system.

First, a plasma deposition system shown in FIG. 1 will be described. As shown in FIG. 1, the plasma deposition system has a vacuum vessel 1 of, e.g., aluminum. The vacuum vessel 1 comprises a first cylindrical vacuum chamber 11 arranged upward for producing plasma, and a second cylindrical vacuum chamber 12 arranged downward to be communicated with the first vacuum chamber 11. Furthermore, the vacuum vessel 1 is grounded to have zero potential.

The upper end of the vacuum vessel 1 has an opening, in which a transmission window 13 formed of a material capable of transmitting microwaves, e.g., quartz, is airtightly provided to maintain vacuum in the vacuum vessel 1. Outside of the transmission window 13, a waveguide 15 connected to a microwave power supply part 14 serving as a high-frequency supply means for producing a plasma of, e.g., 2.45 GHz and 1.5 kW is provided. The microwaves produced by the microwave power supply part 14 are guided by the waveguide 15 in, e.g., a TE mode, or the microwaves guided in the TE mode are changed by the waveguide 15 to a TM mode, to be introduced into the first vacuum vessel 11 via the transmission window 13.

On the side wall defining the first vacuum vessel 11, gas nozzles 16 are arranged at regular intervals in the circumferential directions thereof. A gas source (not shown), e.g., an Ar gas source, is connected to the gas nozzles 16 so as to uniformly supply Ar gas to the upper portion of the first vacuum vessel 11.

In the second vacuum vessel 12, a wafer mounting table 17 having substantially the same size as that of a wafer W is supported on a supporting part 18 via an insulator (not shown) of, e.g., aluminum, so as to face the first vacuum vessel 11. An electrode is embedded in the mounting table 17, and connected to a high-frequency power supply part 19 so as to supply an ion drawing bias voltage thereto.

On the other hand, as shown in FIG. 1, the upper portion of the second vacuum chamber 12, i.e., a portion communicated with the first vacuum chamber 11, is provided with a ring-shaped deposition gas supply part 20. The deposition gas supply part is designed to jet deposition gases, e.g., $C_4F_8$ and $C_2H_4$ gases, which are fed from a gas supply pipe (not shown), into the second vacuum chamber 12. Furthermore, the Ar gas and the deposition gases corresponds to treatment gases. On the side wall of the second vacuum chamber 12, a gate valve 21 for introducing wafers into the second vacuum vessel 12 is provided. To the other side of the side wall, an electron adhesion type mass spectrometer 3, which will be described later, is connected. To the bottom of the second vacuum chamber 12, exhaust pipes 22 are connected at, e.g., two positions which are symmetrical with respect to the central axis of the second vacuum chamber 12.

On the periphery of the side wall defining the first vacuum vessel 11, a ring-shaped main electromagnetic coil 23 serving as a magnetic field forming means is arranged so as to be close to the first vacuum vessel 11. Beneath the second vacuum vessel 12, a ring-shaped auxiliary electromagnetic coil 24 is arranged so as to be close to the second vacuum vessel 12.

Figure 3:
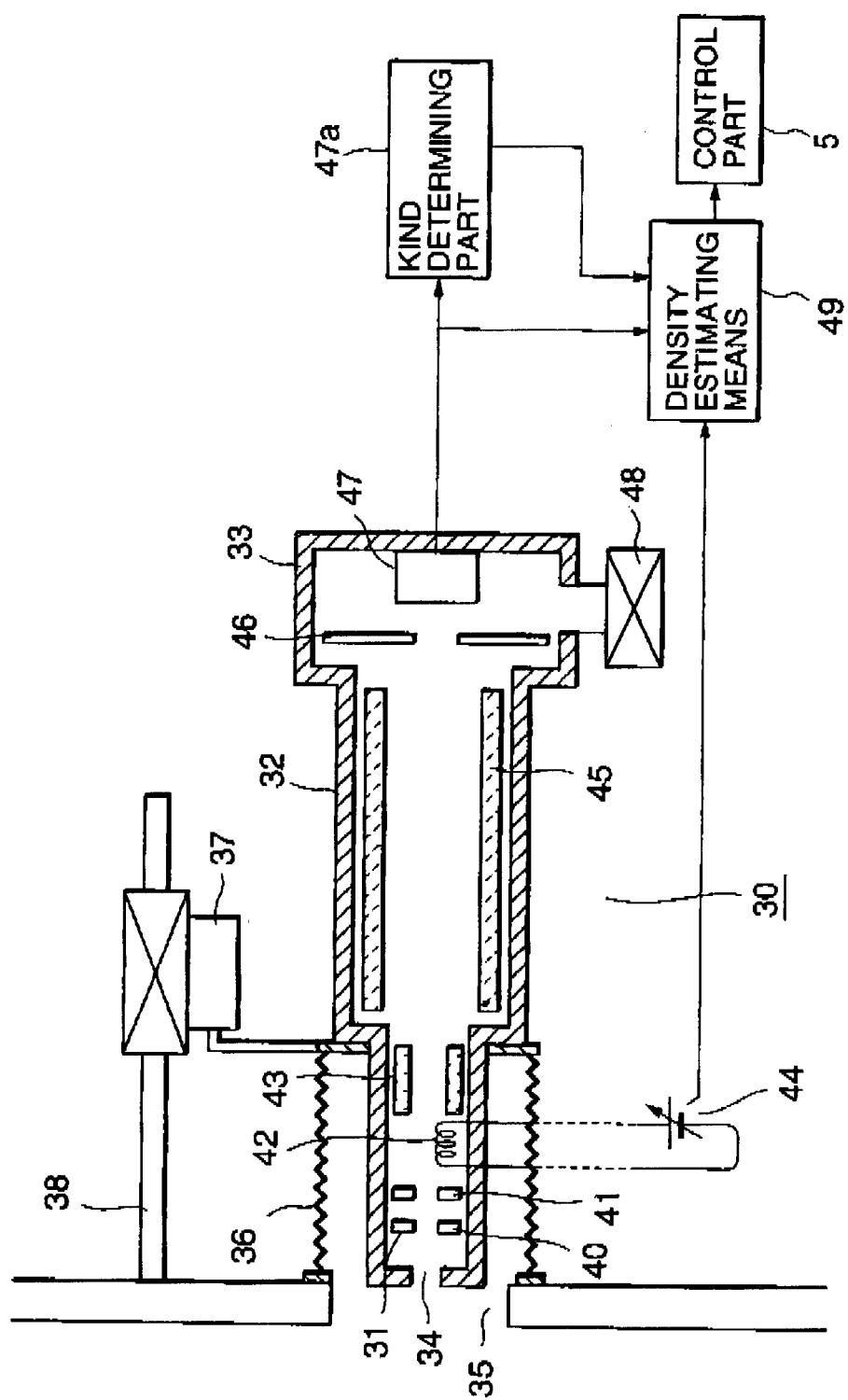
FIG. 3 is a diagram showing a longitudinal section of an electron adhesion type mass spectrometer for use in a treatment system according to the present invention, and blocks related thereto.

Referring to FIG. 3, the electron adhesion type mass spectrometer 3 will be described below.

The mass spectrometer 3 has a cylindrical body 30 comprising an introducing pipe 31, an ion passage part 32 and an ion detecting part 33, which are arranged in that order from the vacuum vessel 1. The introducing pipe 31 has an extracting port 34 on one end thereof. The extracting port 34 is arranged so as to face the vacuum vessel 1 via a hole 35 formed in the side wall of the vacuum vessel 1. The introducing pipe 31 is made of a new metal or permalloy, which is a material having a high permeability.

The periphery of the introducing pipe 31 is surrounded by a metallic bellows body 36, both ends of which are airtightly mounted on a portion surrounding the base end portion of the introducing pipe 31 and a portion surrounding the hole 35, respectively. The bellows body 36 is connected to a driving part 37, such as an air cylinder, which is guided along a rail 38. Therefore, in accordance with the movement of the driving part 37, the bellows body 36 expands and contracts to allow the introducing pipe 33 into the vacuum chamber 1. Furthermore, the hole 35 may be open and closed by a lid (not shown). In this case, the first and second vacuum chambers 11 and 12 can be separated from the electron adhesion type mass spectrometer 3 by tightly closing the hole 35 by the lid, so that process conditions can be more easily controlled.

In the introducing pipe 31, a first focus ring 40, a second focus ring 41, a filament 42 serving as a part of an electron adding means for adding electrons to radicals, and an electrode 43 for drawing ions are arranged in that order from the extracting port 34. The filament 42 is connected to a direct voltage source 44 capable of varying voltage.

In the ion passage part 32, four rod-shaped electrodes 45 arranged in the vicinity of the periphery of the ion passage part 32 so as to extend in longitudinal directions thereof. Two pairs of the electrodes 45 facing each other serve as a quadrupole. In the ion detector 33, a third focus ring 46 and a detector 47 for detecting a current value due to negative ions are arranged in that order from the ion passage part 32. Furthermore, the body is evacuated to a predetermined degree of vacuum by means of a vacuum pump 48.

The value (current value) detected by the detector 47 is fed to a kind determining part 47a, which derives the relationship between the mass number of the negative ions and the measured value (relative intensity) of the number of the negative ions, i.e., a mass spectrum, to determine the kind of the negative ions on the basis of the mass spectrum. This determination is carried out on the basis of data which are obtained by deriving the mass number at the peak of the measured value of the negative ions and deriving a correspondence between the previously prepared mass number and the kind of the negative ions on the basis of the derived mass number.

The detected value is fed to a density estimating means 49. The density estimating means 49 has the function of grasping the relationship between the value of the energy of electrons emitted from the filament 42 and the measured value when the voltage of the direct voltage source 44 is varied, deriving the peak of the measured value, and estimating the density of specific radicals in plasma on the basis of the peak value. The results estimated by the density estimating means 49 are fed to the control part 5.

Figure 4:
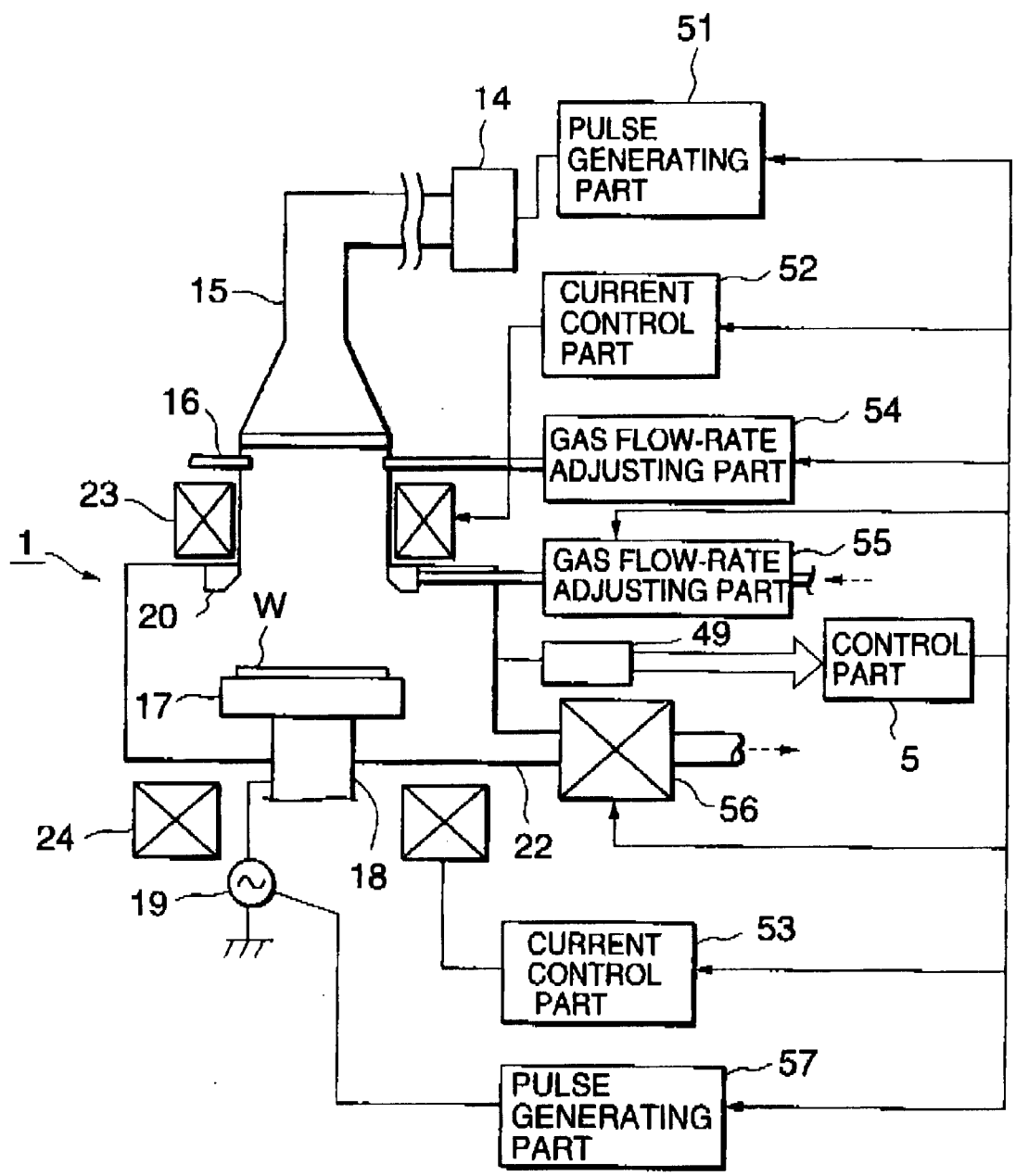
FIG. 4 is a block diagram of the preferred embodiment of the present invention.

FIG. 4 is a block diagram of a control system for controlling process conditions influencing the density of specific particles, e.g., radicals in this example, in plasma, on the basis of the estimated results obtained by the density estimating means 49. FIG. 4 shows signal lines extending from the control part 5. This point will be described later. In this preferred embodiment, an example where control signals outputted from the control part 5 control only a pulse generating part 51 for modulating the output power of the microwave power supply part 14 will be described.

The operation of this preferred embodiment will be described below. First, the magnetic field formed by the electromagnetic coils 14 and 15 is associated with microwaves to cause electron cyclotron resonance, so that Ar gas supplied from the nozzles 16 and, e.g., $C_4F_8$ and $C_2H_4$ gases, supplied from the gas supply part 20 are activated to plasma, respectively.

On the other hand, during a deposition treatment, the extracting port 34 of the body 30 of the electron adhesion type mass spectrometer 3 protrudes above the center of a wafer W, and the interior of the body 30 of the electron adhesion type mass spectrometer 3 is maintained to be higher vacuum than the vacuum vessel 1. Therefore, a part of plasma is drawn into the extracting port 34 to be incorporated into the body 30 via the first and second focus rings 40 and 41. Then, electrons emitted from the filament 42 are added to particles, such as radicals, contained in the plasma, so that the radicals are ionized. For example, $C_4F_7$ radicals become negative ions of $C_4F_7$—.

Figure 5:
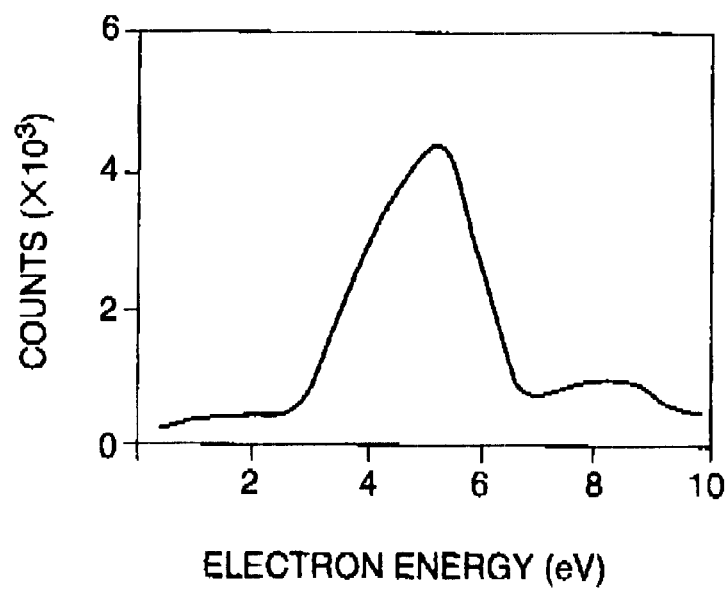
FIG. 5 is a graph showing an example of a correspondence between the value of electron energy and the measured value of the number of ions in an electron adhesion type mass spectrometer.

As described above, a superimposed voltage of a positive or negative direct voltage U (volts) and a high-frequency voltage V' (volts) [frequency f (MHz) ] is previously supplied from power supply parts (not shown) to the electrodes 45 of two pairs of hyperbolic cylindrical rods (quadrupole). If V' is continuously varied while U/V' is maintained to be constant, ions corresponding to the respective masses can be detected by the detector 47. The kind determining part 47a prepares a mass spectrum on the basis of the detected signal from the detector as described above, and selects a mass number contained in a predetermined range of mass number, from the mass numbers at the peak values in the mass spectrum. Then, the values of U and V' are set every negative ions of the selected mass number so as to accelerate the negative ions, to vary the filament voltage to vary electron energy emitted from the filament 42, to acquire data relating to a correspondence between the value of the electron energy and the measured value of the number of ions. FIG. 5 shows an example of the acquired data. It can be seen from this figure that the peak value varies in accordance with pressure.

The inventor has grasped that the peak value of the measured value of negative ions corresponds to the density of target radicals. In this preferred embodiment, it is previous grasped how much the power of microwaves increases (or decreases) with respect to the peak value of the number of negative ions (e.g., $C_4F_7$—), and the peak value is inputted to an automatic control circuit, which supplies a control signal to the pulse generating part 51 to control the state of plasma. In this case, the relative value of the density of radicals is grasped to control the density of radicals.

Figure 7:
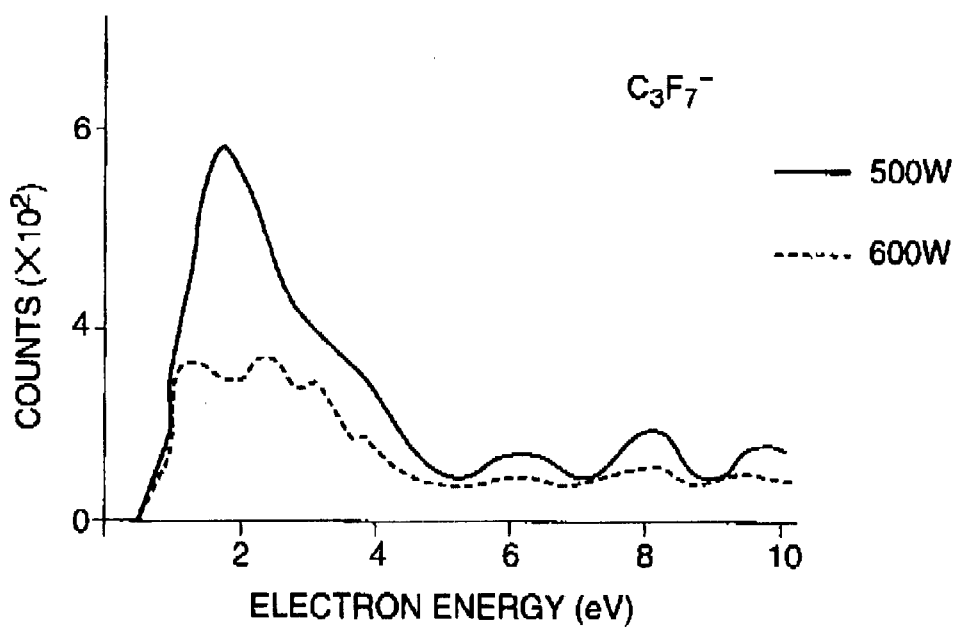
FIG. 7 is a graph showing an example of a correspondence between the value of electron energy and the measured value of the number of ions in an electron adhesion type mass spectrometer.
Figure 8:
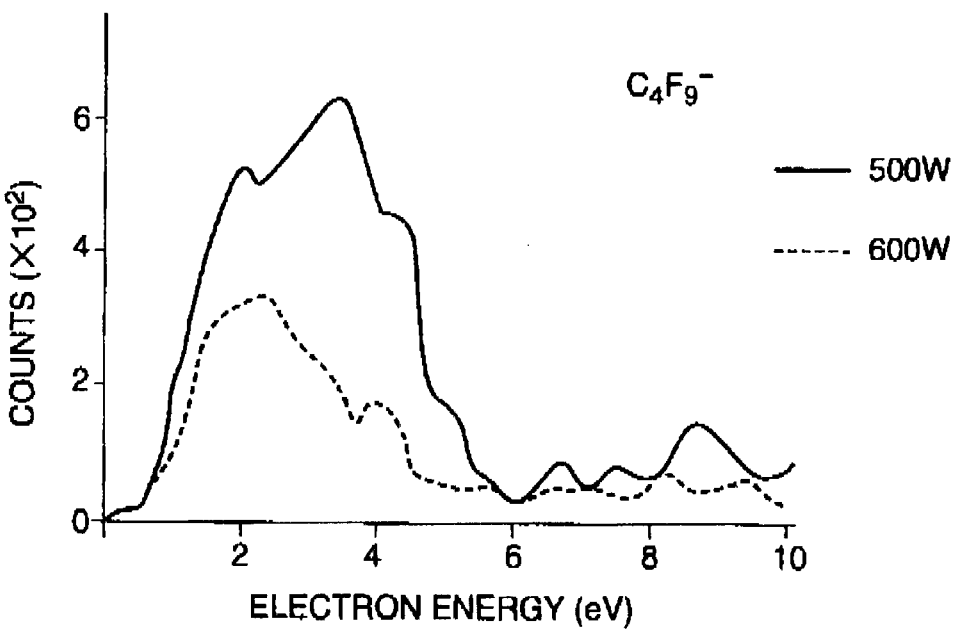
FIG. 8 is a graph showing an example of a correspondence between the value of electron energy and the measured value of the number of ions in an electron adhesion type mass spectrometer.

FIGS. 7 and 8 show examples where the peak value varies the magnitude of microwaves with respect to radicals $C_3F_7$— and $C_4F_9$— obtained by negative ionizing $C_4F_8$ gas used as a treatment gas. In each of these figures, microwaves of 500 W (solid line) and 600 W (dotted line) are measured at a pressure of 20 Torr.

Furthermore, data relating to the peak value and the density of specific radicals, e.g., $C_4F_7$ radicals, may be previously prepared, and the detected peak value may be applied to the data to estimate the density of radicals corresponding to the peak value to supply a control signal corresponding to the estimated value to, e.g., the pulse generating part 51.

The density of radicals thus estimated can be controlled to a target value by controlling the electronic temperature of plasma. The electronic temperature of plasma can be adjusted by pulse-modulating microwaves outputted from the microwave power supply part 14. The adjusting way in the case of radicals having a density increasing as the energy increases is different from the adjusting way in the case of radicals having a density decreasing as the energy increases. For example, in the former, assuming that the microwaves are pulse-modulated by a pulse having a certain duty ratio, if the density of radicals exceeds a preset value, the duty ratio of the microwave power is increased to increase the energy of microwaves supplied to the gas, so that the density of radicals is controlled so as to decrease. In addition, in order to control the energy (power) of microwaves, the output power value of the microwave power supply part 14 may be controlled in place of the control of the duty ratio, or these controls may be combined.

According to this preferred embodiment, the density of, e.g., $C_4F_7$ radicals, in plasma in the vacuum vessel 1 can be estimated, and the power of the microwave power supply part 14 is controlled on the basis of the estimated density, so that the density of radicals can be set to be an appropriate value. Therefore, it is possible to carry out a treatment wherein the dispersion in wafer W is small, e.g., the thickness and quality of the wafer W are uniform. In addition, since a gas is extracted from the gas extracting port to give electrons to the gas to ionize the gas to count negative ions, there is no problem in that precision is decreased due to soil of the window provided in the vacuum vessel.

Furthermore, in the above described preferred embodiment, the density of radicals is derived during the treatment of product wafers W to be fed back to the real time control part 5 to control process conditions. However, the present invention should not be limited thereto. After a predetermined number of wafers are treated, a treatment may be carried out using a test wafer to measure the density of radicals during the treatment to set process conditions, such as the duty ratio of microwaves, on the basis of the measured value during the subsequent treatment of product wafers W to control the process conditions.

In order to control the process conditions, in addition to the microwave power, current control parts 52 and 53, which are shown in FIG. 4, for controlling the current values of the main electromagnetic coil 23 and the auxiliary electromagnetic coil 24, respectively, may be controlled to change the intensity and shape of a magnetic field. Alternatively, gas flow-rate adjusting parts 54 and 55 connected to the gas nozzles 16 and the gas supply part 20, respectively, may be controlled so as to adjust the flow rates and mixing ratio of treatment gases, or the opening and closing of a butterfly valve of a pressure adjusting part 56 provided in the middle of the exhaust pipe 22 may be controlled so as to adjust the pressure in the vacuum vessel 1. Also with respect to the high-frequency power supply part 19, the power value or bias may be controlled. When a pulse modulation is carried out by means of a pulse generating part 57, the duty ratio may be controlled by the control signal via the pulse generating part 57. This is particularly effective in etching of a thin film on a wafer W. Moreover, these controls of process conditions may be combined. As the way of adjusting the process conditions, the process conditions may be previously adjusted to change the density of radicals, and a program may be prepared on the basis of the obtained data.

Figure 9:
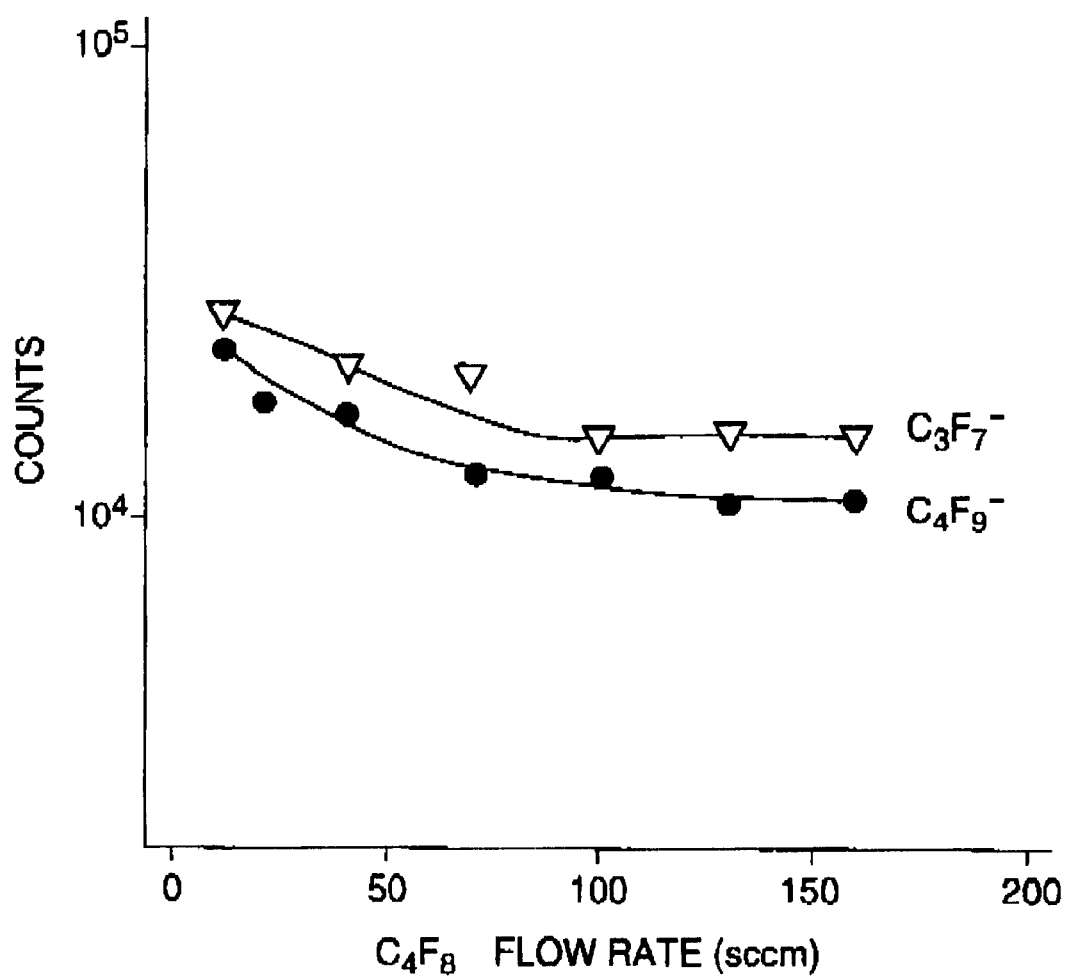
FIG. 9 is a graph showing an example of a correspondence between the variation in flow rate of a treatment gas and the measured value of the number of ions.

FIG. 9 is a graph showing the variation in peak value of radicals negative-ionized by changing the flow rate of $C_4F_8$ serving as a treatment gas. In this figure, $C_3F_7$ and $C_4F_9$ are measured as examples of radicals. This figure shows that the peak value of ions decreases as the flow rate of $C_4F_8$ increases. Therefore, it can be seen that the density of radicals varies in accordance with the flow rate of the treatment gas.

Figure 6:
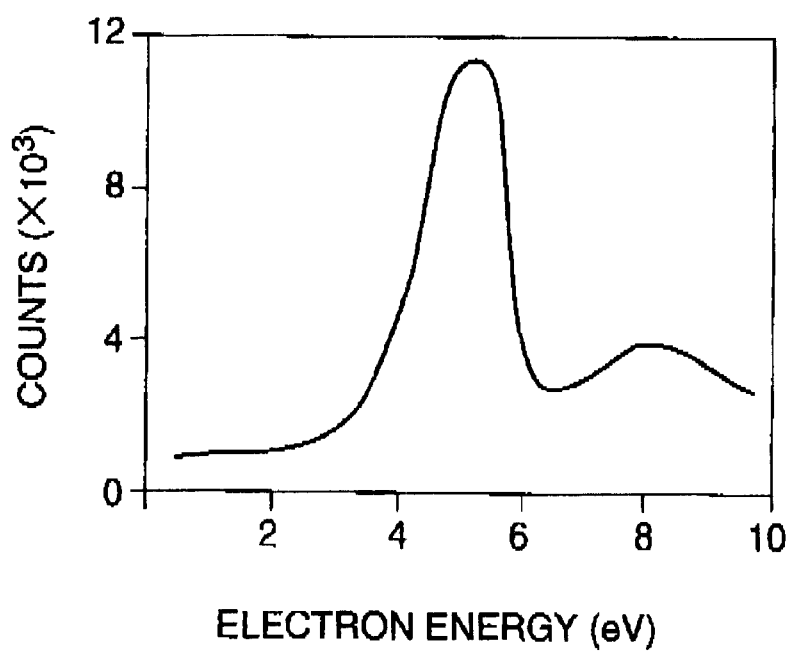
FIG. 6 is a graph showing an example of a correspondence between the value of electron energy and the measured value of the number of ions in an electron adhesion type mass spectrometer.

In the above described preferred embodiment, the estimation of the density of radicals using the density estimating means 49 has been carried out on the basis of ion count data obtained by negative ionizing target radicals, e.g., $C_4F_7$, in the electron addition type mass spectrometer 3. However, in some kinds of radicals, e.g., $CF_4$ radicals, F-ions are dissociated by adding electrons. In such a case, the density of $CF_4$ radicals is estimated on the basis of the measured value of the dissociated negative ions, e.g., F-ions. The present invention also includes this case. In addition, the kind of radicals should not be limited to $CF_4$, and the specific particles should not be limited to radicals, but the particles may be molecules or atoms. Furthermore, FIG. 6 is a characteristic diagram showing the measured value of the above described F-ions.

Furthermore, in this preferred embodiment, a method for estimating a distribution of concentration of radicals above a wafer may be used. In this method, the bellows 36 is expanded and contracted by means of the driving part 38 of the electron addition type mass spectrometer 3, and the counted values of negative ions at a plurality of places in radial directions of a wafer are derived by changing the position of the extracting port 34. Furthermore, according to the present invention, a nozzle may be airtightly inserted into the extracting port 34 to provide a bellows between the outside of the extracting port 34 and the periphery of the hole 35, to reciprocate the nozzle while the body 30 is fixed.

The present invention may be applied to a helicon wave type system, a parallel plate type system, an inductively coupled plasma (ICP) system and so forth, other than the ECR. In addition, the invention may be applied to plasma treatments other than deposition and etching, e.g., the ashing of a resist. Moreover, the present invention may be applied to any systems for treating substrates using treatment gases, other than the plasma treatment system, e.g., a thermal CVD system.

According to the treatment system of the present invention, the density of particles, e.g., radicals, in a vacuum vessel can be estimated, and factors (process conditions) influencing the state of plasma can be controlled on the basis of the estimated results, so that it is possible to carry out a good treatment.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A gas treatment system for supplying a treatment gas into a vacuum vessel to carry out a predetermined treatment for a substrate to be treated, said system comprising:

electron adding means for emitting electrons to said treatment gas extracted from said vacuum vessel and for causing electrons to adhere to particles in said treatment gas for generating negative ions of said particles;

mass spectrometry means for determining the kind of negative ions of said particles, to which electrons adhere, by said electron adding means;

density estimating means for estimating the density of said particles in said treatment gas corresponding to the determined negative ions, on the basis of the measured value of the number of said negative ions determined by said mass spectrometry means; and a control part for controlling a process condition, which influences the state of said treatment gas in said vacuum vessel, on the basis of the estimated result of the density of said particles estimated by said density estimating means.

2. A gas treatment system as set forth in claim 1, wherein said density estimating means varies the magnitude of electron energy emitted from said electron adding means, to derive the variation in measured value of said negative ions of said particles, to use data corresponding to the peak value of the measured value as said estimated result of said density of said particles.

3. A gas treatment system as set forth in claim 1, wherein said mass spectrometry means has a gas extracting port which is movable in said vacuum vessel.

4. A gas treatment system as set forth in claim 1, wherein said electron adding means is connected to said vacuum vessel via a bellows which is retractable with respect to said vacuum vessel.

5. A gas treatment system as set forth in claim 1, wherein said process condition is at least one of the magnitude of energy applied to said treatment gas, the pressure in said vacuum vessel, and the flow rate of said treatment gas.

6. A gas treatment system as set forth in claim 1, wherein said particles in said treatment gas, to which electrons adhere, are radicals, molecules or atoms.

7. A gas treatment system as set forth in claim 1, wherein said control part carries out a feedback in real time on the basis of the estimated result of the density of said particles estimated by said density estimating means, to control said process condition.

8. A gas treatment system as set forth in claim 1, wherein said control part sets and controls said process condition with respect to a subsequent product substrate to be treated, on the basis of the estimated result of the density of said particles estimated by said density estimating means with respect to a test substrate to be treated.

9. A gas treatment method for supplying a treatment gas into a vacuum vessel to carry out a predetermined treatment for a substrate to be treated, said method comprising the steps of:

extracting said treatment gas, and causing electron adding means to emit electrons to the extracted treatment gas to cause electrons to adhere to particles in said treatment gas;

causing mass spectrometry means to determine the kind of negative ions of said particles, to which electrons adhere, by said electron adding means;

causing density estimating means to estimate the density of said particles in said treatment gas corresponding to the determined negative ions, on the basis of the measured value of the number of said negative ions determined by said mass spectrometry means; and causing a control part to control a process condition, which influences the state of said treatment gas in said vacuum vessel, on the basis of the estimated result of the density of said particles estimated by said density estimating means.

10. A gas treatment method as set forth in claim 9, wherein said density estimating means varies the magnitude of electron energy emitted from said electron adding means, to derive the variation in measured value of said negative ions of said particles, to use data corresponding to the peak value of the measured value as said estimated result of said density of said particles.

11. A gas treatment method as set forth in claim 9, wherein said mass spectrometry means has a gas extracting port which is movable in said vacuum vessel.

12. A gas treatment method as set forth in claim 9, wherein said electron adding means is connected to said vacuum vessel via a bellows which is retractable with respect to said vacuum vessel.

13. A gas treatment method as set forth in claim 9, wherein said process condition is at least one of the magnitude of energy applied to said treatment gas, the pressure in said vacuum vessel, and the flow rate of said treatment gas.

14. A gas treatment method as set forth in claim 9, wherein said particles in said treatment gas, to which electrons adhere, are radicals, molecules or atoms.

15. A gas treatment method as set forth in claim 9, wherein said control part carries out a feedback in real time on the basis of the estimated result of the density of said particles estimated by said density estimating means, to control said process condition.

16. A gas treatment method as set forth in claim 9, wherein said control part sets and controls said process condition with respect to a subsequent product substrate to be treated, on the basis of the estimated result of the density of said particles estimated by said density estimating means with respect to a test substrate to be treated.

\* \* \* \* \*